(12) United States Patent
Hsu et al.

(10) Patent No.: US 11,955,196 B2
(45) Date of Patent: Apr. 9, 2024

(54) MEMORY DEVICE, VOLTAGE GENERATING DEVICE AND VOLTAGE GENERATING METHOD THEREOF

(71) Applicant: NANYA TECHNOLOGY CORPORATION, New Taipei (TW)

(72) Inventors: Ting-Shuo Hsu, New Taipei (TW); Chih-Jen Chen, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 135 days.

(21) Appl. No.: 17/863,407

(22) Filed: Jul. 13, 2022

(65) Prior Publication Data

US 2024/0021221 A1 Jan. 18, 2024

(51) Int. Cl.
G11C 5/14 (2006.01)

(52) U.S. Cl.
CPC .............. *G11C 5/147* (2013.01); *G11C 5/145* (2013.01)

(58) Field of Classification Search
CPC ................................ G11C 5/147; G11C 5/145
See application file for complete search history.

(56) References Cited

U.S. PATENT DOCUMENTS

| | | | |
|---|---|---|---|
| 5,097,303 A * | 3/1992 | Taguchi | G05F 1/465 365/226 |
| 6,774,708 B2 | 8/2004 | Matsui | |
| 10,707,751 B2 | 7/2020 | Janjua et al. | |
| 2001/0012220 A1 * | 8/2001 | Butler | G11C 11/4074 365/189.09 |
| 2002/0114184 A1 * | 8/2002 | Gongwer | G11C 5/14 365/185.11 |
| 2005/0030088 A1 * | 2/2005 | Cernea | G11C 5/145 327/536 |
| 2006/0067154 A1 * | 3/2006 | Bedeschi | G11C 8/08 365/230.06 |
| 2008/0024096 A1 * | 1/2008 | Pan | G11C 5/145 323/271 |
| 2008/0219076 A1 * | 9/2008 | Cheng | G11C 11/4076 365/226 |
| 2010/0007408 A1 * | 1/2010 | Yamahira | G11C 5/145 327/541 |

(Continued)

FOREIGN PATENT DOCUMENTS

| | | |
|---|---|---|
| CN | 111146940 | 5/2020 |
| TW | I572135 | 2/2017 |
| TW | I699765 | 7/2020 |

OTHER PUBLICATIONS

"Office Action of Taiwan Counterpart Application", dated Sep. 21, 2023, p. 1-p. 6.

*Primary Examiner* — Khamdan N. Alrobaie
(74) *Attorney, Agent, or Firm* — JCIPRNET

(57) ABSTRACT

A voltage generating device includes a clock signal generator, a voltage regulator and a pump circuit. The clock signal generator generates a clock signal according to an enable signal. The voltage regulator generates and adjusts a first voltage according to a reference voltage and the enable signal. The pump circuit receives the clock signal, the first voltage and a second voltage, wherein the pump circuit performs a voltage pump operation to generate an output voltage based on the clock signal according to the first voltage and the second voltage. The output voltage equals to a summation of the first voltage and the second voltage.

16 Claims, 3 Drawing Sheets

(56) References Cited

U.S. PATENT DOCUMENTS

| | | | | |
|---|---|---|---|---|
| 2010/0171544 A1* | 7/2010 | Seo | ........................ | G11C 5/145 |
| | | | | 327/536 |
| 2011/0255329 A1 | 10/2011 | Kaku | | |
| 2015/0035579 A1* | 2/2015 | Zhang | ..................... | H02M 1/14 |
| | | | | 327/361 |
| 2018/0335970 A1* | 11/2018 | Chen | ....................... | G11C 5/145 |
| 2020/0144910 A1* | 5/2020 | Janjua | ..................... | G11C 5/145 |

* cited by examiner

MEMORY DEVICE, VOLTAGE GENERATING DEVICE AND VOLTAGE GENERATING METHOD THEREOF

BACKGROUND OF THE INVENTION

Technical Field

The present invention generally relates to a voltage generating device and a voltage generating method thereof and more particularly to the voltage generating device for providing an adjustable output voltage for a fuse blowing operation.

Description of Related Art

In conventional art, a memory device provides a voltage generator to generate voltage for blowing fuses by a voltage pumping operation. The output voltage can be generated by toggling of a clock signal. Furthermore, a voltage value of the output voltage is constant and cannot be adjusted. For example, in a memory device, the voltage generator can be used to provide the output voltage for blowing fuses. Since the output voltage is constant and cannot be adjusted, the fuses cannot be blown well if the voltage value of the output voltage is not suitable for blowing the fuses.

SUMMARY OF THE INVENTION

The present invention provides a memory device, a voltage generating device and a voltage generating method thereof which can adjust the output voltage for blowing at least one fuse.

The voltage generating device includes a clock signal generator, a voltage regulator and a pump circuit. The clock signal generator generates a clock signal according to an enable signal. The voltage regulator generates and adjusts a first voltage according to a reference voltage and the enable signal. The pump circuit receives the clock signal, the first voltage and a second voltage, wherein the pump circuit performs a voltage pump operation to generate an output voltage based on the clock signal according to the first voltage and the second voltage. The output voltage equals to a summation of the first voltage and the second voltage.

The memory device includes a fuse circuit and the voltage generating device mentioned above. The fuse circuit having at least one fuse. The voltage generating device provides the output voltage to blow the at least one fuse.

The voltage generating method includes: generating a clock signal according to an enable signal by a clock signal generator; generating and adjusting a first voltage according to a reference voltage and the enable signal by a voltage regulator; and performing a voltage pump operation to generate an output voltage based on the clock signal according to the first voltage and the second voltage by a pump circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
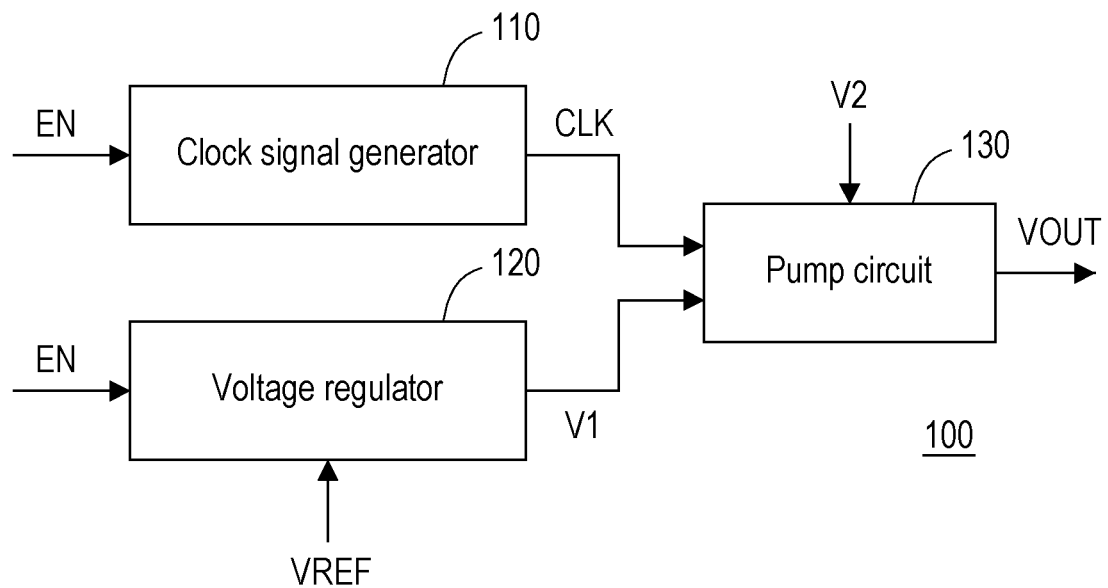
FIG. 1 illustrates a schematic diagram of a voltage generating device according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a schematic diagram of a voltage generating device according to an embodiment of present disclosure. The voltage generating device 100 includes a clock signal generator 110, a voltage regulator 120 and a pump circuit 130. The clock signal generator 110 is used to generate a clock signal CLK according to an enable signal EN. The voltage regulator 120 receives the enable signal EN and a reference voltage VREF, and generates a voltage V1 according to the enable signal EN, where the reference voltage VREF is a pre-set voltage. In this embodiment, the voltage generating device 100 may be activated by the enable signal EN. If the enable signal EN is at a specific logic level (such as logic 1), the clock signal generator 110 is activated to generate the clock signal CLK and the voltage regulator 120 is activated to generate the voltage V1 according to the reference voltage VREF.

On the other hand, the pump circuit 130 is coupled to the clock signal generator 110 and the voltage regulator 120. The pump circuit 130 receives a voltage V1, and further receives the clock signal CLK from the clock signal generator 110 and receives the voltage V1 from the voltage regulator 120. The pump circuit 130 performs a voltage pump operation on the voltages V1 and V2 based on the clock signal CLK for generating an output voltage VOUT. In this embodiment, the output voltage VOUT may equal to a summation of the voltage V1 and V2.

In this embodiment, the voltage regulator 120 may adjust the voltage V1 by necessary. The voltage regulator 120 can increase or decrease the voltage V1. In a memory device, the voltage generating device 100 may provide the output voltage VOUT to blow one or more fuse in a fuse circuit of the memory device. The voltage V1 can be adjusted according to a type of the fuse by the voltage regulator 120. If the voltage regulator 120 increases the voltage V1, the voltage generating device 100 can provides the output voltage VOUT with higher voltage value, and if the voltage regulator 120 decreases the voltage V1, the voltage generating device 100 can provides the output voltage VOUT with lower voltage value. Such as that, the voltage generating device 100 can provide the output voltage VOUT with aa suitable voltage value to blow the at least one fuse of the memory device.

In this embodiment, the clock signal generator 110 may be a crystal oscillator, a resonator, a resistor-capacitor (RC) oscillator or any type oscillator well known by a person skilled in this art, and no more special limitation here.

Figure 2:
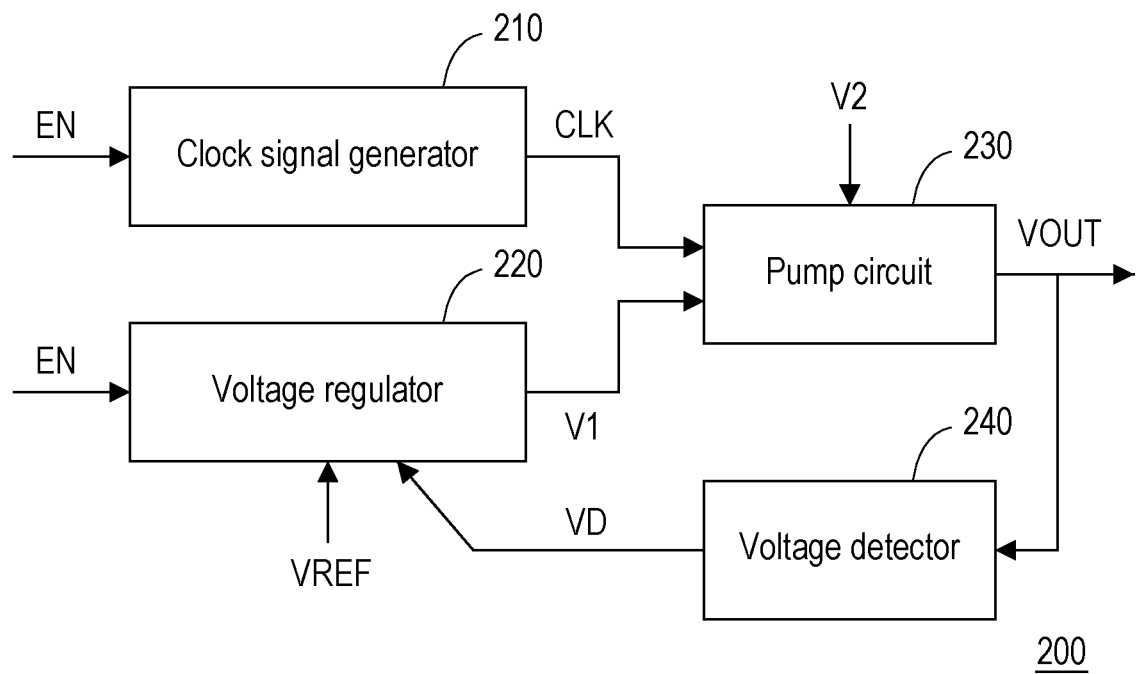
FIG. 2 illustrates a schematic diagram of a voltage generating device according to another embodiment of present disclosure.

Please refer to FIG. 2, which illustrates a schematic diagram of a voltage generating device according to another embodiment of present disclosure. The voltage generating device 200 includes a clock signal generator 210, a voltage regulator 220, a pump circuit 230 and a voltage detector 240.

The clock signal generator 210 is used to generate a clock signal CLK according to an enable signal EN. The voltage regulator 220 receives the enable signal EN and a reference voltage VREF, and generates a voltage V1 according to the enable signal EN, where the reference voltage VREF is a pre-set voltage. In this embodiment, the voltage generating device 200 may be activated by the enable signal EN. If the enable signal EN is at a specific logic level (such as logic 1), the clock signal generator 210 is activated to generate the clock signal CLK and the voltage regulator 220 is activated to generate the voltage V1 according to the reference voltage VREF. The pump circuit 230 is coupled to the clock signal generator 210 and the voltage regulator 220. The pump circuit 230 receives the clock signal CLK, the voltage V1 and a voltage V2, and generates an output voltage VOUT by a voltage pump operation according to the voltages V1 and V2 and the clock signal CLK.

It should be noted here, different from the voltage generating device 100, the voltage generating device 200 further includes the voltage detector 240. The voltage detector 240 may be coupled between the pump circuit 230 and the voltage regulator 220. The voltage detector 240 may detect the output voltage VOUT to generate a detecting result VD. The voltage detector 240 provides the detecting result VD to the voltage regulator 220, and the voltage regulator 220 can adjust the voltage V1 by increasing or decreasing voltage value of the voltage V1.

The voltage detector 240 may be implemented by a voltage comparator. The voltage detector 240 may compare the output voltage VOUT with one or two threshold voltages to obtain the detecting result VD. For example, the voltage detector 240 may compares the output voltage VOUT with a first threshold voltage to generate the detecting result VD. If the output voltage VOUT is greater than the first threshold voltage, the detecting result VD may indicate a voltage value of the output voltage VOUT is higher than a target voltage value. Such as that, the voltage regulator 220 may decrease the voltage V1. On the other hand, the voltage detector 240 may also compares the output voltage VOUT with a second threshold voltage to generate the detecting result VD. If the output voltage VOUT is smaller than the second threshold voltage, the detecting result VD may indicate a voltage value of the output voltage VOUT is lower than a target voltage value. Such as that, the voltage regulator 220 may increase the voltage V1. In this embodiment, the detecting result VD may a digital code or an analog signal, and no more special limitation here.

In this embodiment, the voltage regulator 220 may be a low drop-out (LDO) voltage regulator. The voltage regulator 220 may adjust a resistance of a feedback resistor to adjust the voltage V1. A hardware structure of the LDO voltage regulator is well known by a person skilled in this art, and no more repeated description here.

Figure 3:
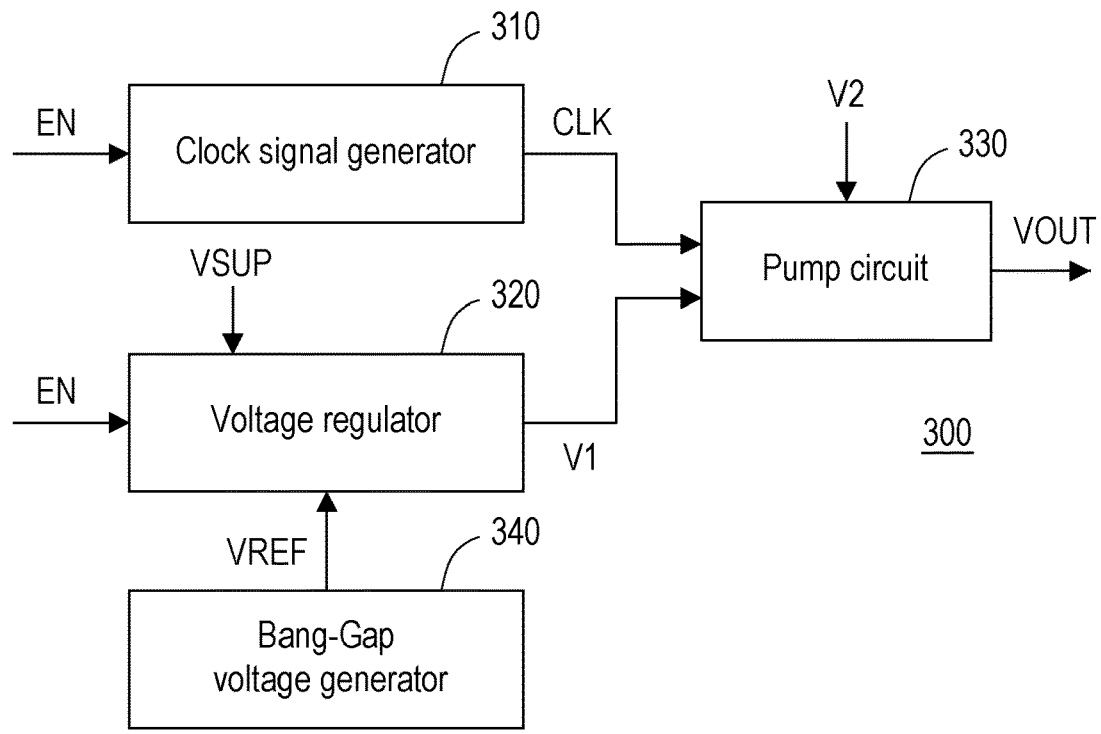
FIG. 3 illustrates a schematic diagram of a voltage generating device according to another embodiment of present disclosure.

Please refer to FIG. 3, which illustrates a schematic diagram of a voltage generating device according to another embodiment of present disclosure. The voltage generating device 300 includes a clock signal generator 310, a voltage regulator 320, a pump circuit 330 and a band-gap voltage generator 340. The clock signal generator 310 is used to generate a clock signal CLK according to an enable signal EN. The voltage regulator 320 receives the enable signal EN and a reference voltage VREF, and generates a voltage V1 according to the enable signal EN, where the reference voltage VREF is a pre-set voltage. In this embodiment, the voltage generating device 300 may be activated by the enable signal EN. If the enable signal EN is at a specific logic level (such as logic 1), the clock signal generator 310 is activated to generate the clock signal CLK and the voltage regulator 320 is activated to generate the voltage V1 according to the reference voltage VREF. The pump circuit 330 is coupled to the clock signal generator 310 and the voltage regulator 320. The pump circuit 330 receives the clock signal CLK, the voltage V1 and a voltage V2, and generates an output voltage VOUT by a voltage pump operation according to the voltages V1 and V2 and the clock signal CLK.

Different from the voltage generating device 100, the voltage generating device 300 further provides the band-gap voltage generator 340 to be a reference voltage generator for providing a reference voltage VREF to the voltage regulator 320. In other embodiments, the reference voltage VREF also can be provided by any other voltage source well known by a person skilled in the art. The band-gap voltage generator 340 is only one illustrative example and not used to limit a scope of present invention.

The voltage regulator 320 receive a power voltage VSUP to be an operation voltage. In some embodiments, the voltage regulator 320 may adjust the generated voltage V1 by a trimming operation. The voltage regulator 320 can trim up or trim down the voltage V1 to increase the output voltage VOUT or decrease the output voltage VOUT. Also, the voltage regulator 320 may regulate the generated voltage V1 according to the power voltage VSUP. For example, if the voltage regulator 320 may generate the voltage V1 in a positive relationship with the power voltage VSUP. That is, in a higher power voltage VSUP environment, the voltage regulator 320 may provide the voltage V1 with higher voltage value. In a lower power voltage VSUP environment, the voltage regulator 320 may provide the voltage V1 with lower voltage value.

It can be seen that, only one enable signal EN is necessary for the voltage generating device 300. A circuit structure of the voltage generating device 300 is not complex, and a cost of the voltage generating device 300 can be reduced.

Figure 4:
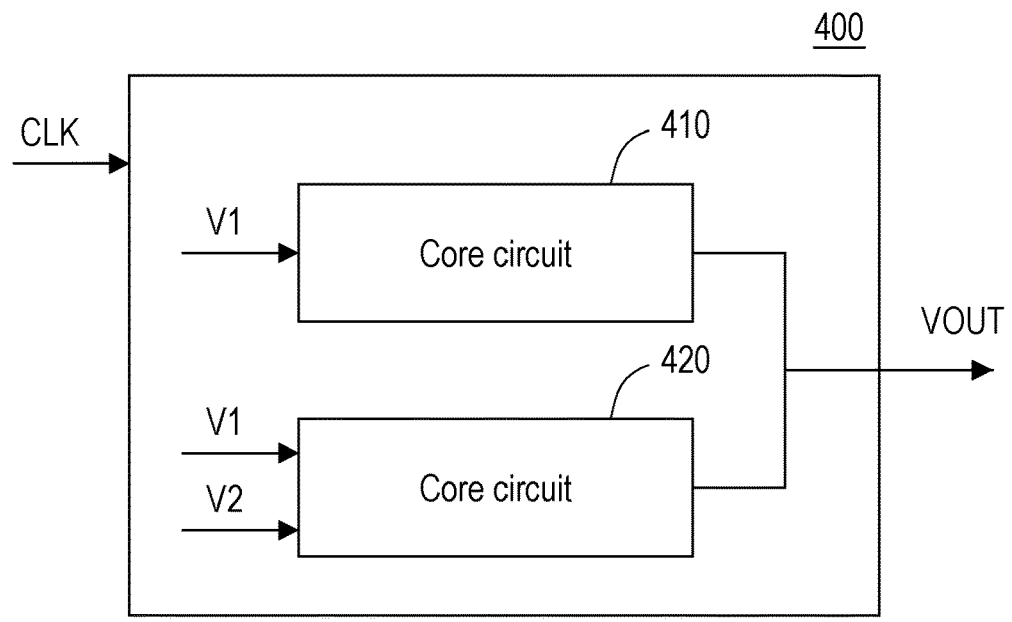
FIG. 4 illustrates a schematic diagram of a pump circuit according to an embodiment of present disclosure.

Please refer to FIG. 4, which illustrates a schematic diagram of a pump circuit according to an embodiment of present disclosure. The pump circuit 400 includes core circuits 410 and 420. The core circuits 410 and 420 are coupled together. The core circuit 410 receives a voltage V1 which can be generated by the voltage regulator 320 of the voltage generating device 300. The core circuit 420 receives the voltage V1 and a voltage V2, wherein the voltage V2 is inputted by an external device. The core circuits 410 and 420 receive a clock signal CLK, and perform a voltage pump operation according to the clock signal CLK. In detail, during the voltage pump operation, the core circuits 410 can save the volage V1 according to the clock signal CLK. Further, the core circuit 420 may shift the voltage V2 by the voltage V1 to generate a voltage V3, and the core circuit 420 may overlay the voltage V3 with the voltage V1 to generate the output voltage VOUT.

Each of the core circuits 410 and 420 may be composed by at least one switch and at least one capacitor. The hardware structure of each of the core circuits 410 and 420 can be implemented by a hardware of any type of pump circuit well known by a person skilled in this art, and no more description here.

Figure 5:
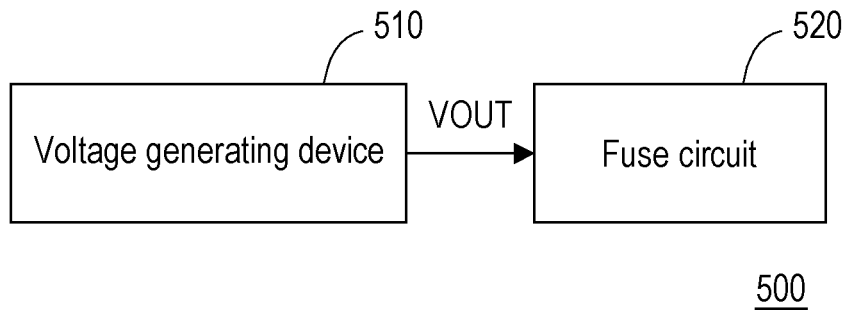
FIG. 5 illustrates a schematic diagram of a memory device according to an embodiment of present disclosure.

Please refer to FIG. 5, which illustrates a schematic diagram of a memory device according to an embodiment of present disclosure. The memory device 500 includes a fuse circuit 520 and a voltage generating device 510. The voltage generating device 510 is coupled to the fuse circuit 520. The fuse circuit 520 includes at least one fuse. The voltage generating device 510 provides an output voltage VOUT to the fuse circuit 520 to blow the at least one fuse of the fuse circuit 520.

The voltage generating device 510 can be implemented by any one of the voltage generating devices 100, 200 or 300. Detail operations of the voltage generating devices 100, 200 or 300 have been described in the embodiments mentioned above.

The memory device 500 may be a dynamic random access (DRAM) device. Of course, the memory device 500 also can be any type memory device well know by a person skilled in the art, and no more special limitation here.

In the memory device 500, the fuse circuit 520 can provide an option code for several applications. The option code can be adjusted by blowing at least one of the fuses of the fuse circuit 520. The voltage generating device 510 may provide the output voltage VOUT with suitable voltage value during a fuse blowing operation is enabled.

It should be noted here, the voltage generating device 510 also can be implemented in an electronic device which is not a memory device. The voltage generating device 510 can be implemented in any electronic device which needs a voltage generator can providing an adjustable voltage.

Figure 6:
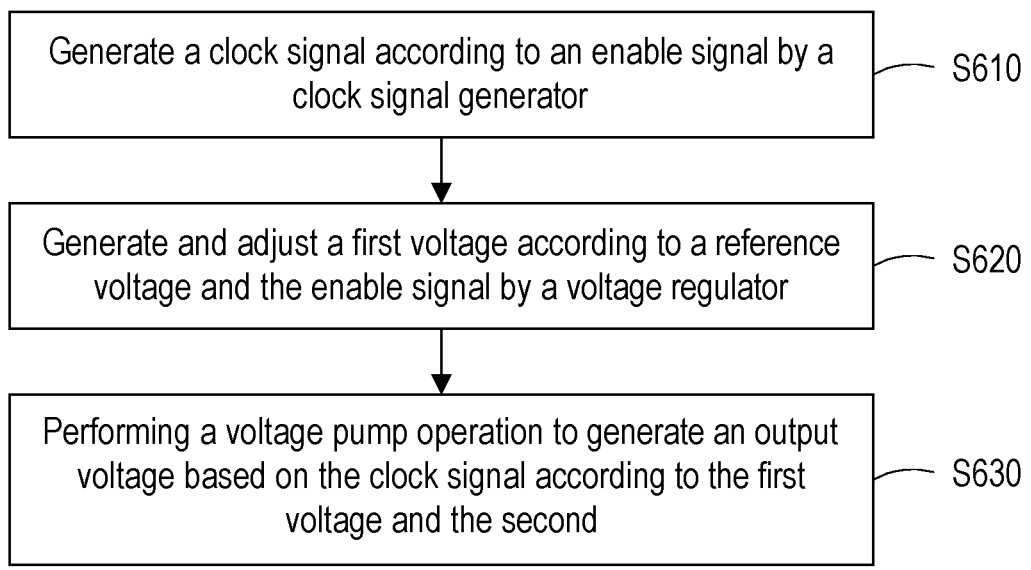
FIG. 6 illustrates a flow chart of a voltage generating method according to an embodiment of present disclosure.

Please refer to FIG. 6, which illustrates a flow chart of a voltage generating method according to an embodiment of present disclosure. In a step S610, a clock signal is generated according to an enable signal by a clock generator. In a step S620, A first voltage can be generated and adjusted according to a reference voltage and the enable signal by a voltage regulator. Furthermore, in a step S630, a voltage pump operation can be performed to generate an output voltage based on the clock signal according to the first voltage and the second voltage by a pump circuit. In this embodiment, the output voltage equals to a summation of the first voltage and the second voltage.

Detail operations of the above steps have been described in the embodiments mentioned above, and no more repeated description here.

In summary, the voltage generating device of present disclosure provides a voltage regulator for generating and adjusting a voltage to be a base voltage. The voltage generating device further generates an output voltage based on the base voltage by a voltage pump operation. Since the base voltage can be adjusted, a voltage value of the output voltage can be adjusted, and a suitable voltage can be obtained for blowing at least one fuse of a circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A voltage generating device, comprising:
 a clock signal generator, generating a clock signal according to an enable signal;
 a voltage regulator, generating and adjusting a first voltage according to a reference voltage and the enable signal; and
 a pump circuit, receiving the clock signal, the first voltage and a second voltage, wherein the pump circuit performs a voltage pump operation to generate an output voltage based on the clock signal according to the first voltage and the second voltage,
 wherein the output voltage equals to a summation of the first voltage and the second voltage.

2. The voltage generating device according to claim 1, wherein the voltage generating device provides the output voltage for blowing at least one fuse of a memory device.

3. The voltage generating device according to claim 1, further comprising:
 a voltage detector, coupled to the pump circuit and the voltage regulator, detecting the output voltage and generating a detecting result by comparing the output voltage with a threshold voltage,
 wherein the voltage regulator adjusts the first voltage according to the detecting result.

4. The voltage generating device according to claim 1, further comprising:
 a reference voltage generator, coupled to the voltage regulator for providing the reference voltage.

5. The voltage generating device according to claim 4, wherein the reference voltage generator is a bang-gap voltage generator.

6. The voltage generating device according to claim 1, wherein the pump circuit comprises:
 a first core circuit, for saving the first voltage; and
 a second core circuit, coupled to the first core circuit, the second core circuit shifts the second voltage by the first voltage to generate a third voltage, and the second core circuit overlay the third voltage with the first voltage to generate the output voltage.

7. The voltage generating device according to claim 1, wherein the voltage regulator is a low drop-out voltage generator.

8. The voltage generating device according to claim 1, wherein the voltage regulator adjusts the first voltage by a trimming operation.

9. The voltage generating device according to claim 1, wherein the voltage regulator receives a power voltage and regulates the output voltage according to the power voltage.

10. A memory device, comprising:
 a fuse circuit having at least one fuse; and
 the voltage generating device as claimed in claim 1, wherein the voltage generating device provides the output voltage to blow the at least one fuse.

11. A voltage generating method, comprising:
 generating a clock signal according to an enable signal by a clock signal generator;
 generating and adjusting a first voltage according to a reference voltage and the enable signal by a voltage regulator; and
 performing a voltage pump operation to generate an output voltage based on the clock signal according to the first voltage and the second voltage by a pump circuit,
 wherein the output voltage equals to a summation of the first voltage and the second voltage.

12. The voltage generating method according to claim 11, further comprising:
provuding the output voltage for blowing at least one fuse of a memory device.

13. The voltage generating method according to claim 11, further comprising:
detecting the output voltage; and
generating a detecting result by comparing the output voltage with a threshold voltage; and
adjusts the first voltage according to the detecting result.

14. The voltage generating method according to claim 11, wherein a step of performing the voltage pump operation to generate the output voltage based on the clock signal according to the first voltage and the second voltage by the pump circuit comprises:
saving the first voltage;
shifting the second voltage by the first voltage to generate a third voltage; and
overlaying the third voltage with the first voltage to generate the output voltage.

15. The voltage generating method according to claim 11, wherein a step of adjusting the first voltage according to the reference voltage comprises:
adjusting the first voltage by a trimming operation.

16. The voltage generating method according to claim 11, further comprising:
receiving a power voltage and regulating the output voltage according to the power voltage by the voltage regulator.

* * * * *